(12) United States Patent
Lin

(10) Patent No.: US 10,411,680 B1
(45) Date of Patent: Sep. 10, 2019

(54) FREQUENCY TRIPLER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/157,156

(22) Filed: Oct. 11, 2018

Related U.S. Application Data

(60) Provisional application No. 62/727,000, filed on Sep. 5, 2018.

(51) Int. Cl.
| | |
|---|---|
| *H03B 19/00* | (2006.01) |
| *H03B 5/36* | (2006.01) |
| *H03L 7/00* | (2006.01) |
| *H03K 5/00* | (2006.01) |
| *H02M 3/07* | (2006.01) |

(52) U.S. Cl.
CPC .......... *H03K 5/00006* (2013.01); *H02M 3/07* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,838,053 | B2 * | 9/2014 | Lin ........................ | H03B 19/00 455/189.1 |
| 9,344,074 | B2 * | 5/2016 | Zerbe ....................... | H03L 7/06 |
| 9,966,937 | B2 * | 5/2018 | Yayla ................... | H03K 3/0315 |

\* cited by examiner

*Primary Examiner* — An T Luu
(74) *Attorney, Agent, or Firm* — McClure, Qualey & Rodack, LLP

(57) ABSTRACT

A circuit includes a first TSCP (tri-state charge pump) configured to receive a first phase and a third phase of a six-phase signal; a second TSCP configured to receive a second phase and a fourth phase of the six-phase signal; a third TSCP configured to receive a third phase and a fifth phase of the six-phase signal; a fourth TSCP configured to receive a fourth phase and a sixth phase, a fifth TSCP configured to receive the fifth phase and the first phase, and a sixth TSCP configured to receive the sixth phase and the second phase of the six-phase signal. The first, third, and fifth TSCPs output currents to a first output node and the second, fourth, and sixth TSCPs output currents to a second output node. A load is placed across the first output node and the second output node.

14 Claims, 4 Drawing Sheets

FREQUENCY TRIPLER AND METHOD THEREOF

CROSS REFERENCE TO RELATED APPLICATIONS

This application claims the benefit of U.S. provisional application No. 62/727,000 filed on Sep. 5, 2018, which is incorporated herein by reference.

BACKGROUND OF THE INVENTION

Field of the Invention

The present invention generally relates to frequency multiplier circuits and more particularly to a frequency tripler circuit.

Description of Related Art

As depicted in FIG. 1, a prior art frequency tripler 100 receives an input signal $S_{in}$ and output an output signal $S_{out}$. Frequency tripling tripler 100 includes a nonlinear circuit 101 configured to receive the input signal $S_{in}$ and output an intermediate signal $S_{int}$, and a bandpass filter 102 configured to receive the intermediate signal $S_{int}$ and output the output signal $S_{out}$. A third-order nonlinearity of the nonlinear circuit 101 causes the intermediate signal $S_{int}$ to contain a rich third harmonic component. The bandpass filter 102 is configured to single out the third harmonic component in the intermediate signal $S_{int}$, so that the third harmonic component is a dominant spectral component in the output signal $S_{out}$. Consequently, a dominant frequency of the output signal $S_{out}$ is three times higher than a fundamental frequency of the input signal $S_{in}$, i.e. $f_{out}=3f_{in}$, where $f_{in}$ is the fundamental frequency of the input signal $S_{in}$, and $f_{out}$ is the dominant frequency of the output signal $S_{out}$.

The prior art frequency tripler 100 is not highly effective. Although the intermediate signal $S_{int}$ may contain a rich third harmonic content, the fundamental component, in practice, is considerably stronger than the third harmonic component. Also, a practical implementation of the bandpass filter 102 can only have a moderate rejection of the fundamental component, unless a circuit of very high quality factor is used. Therefore, the fundamental component usually remains appreciable in the output signal $S_{out}$.

BRIEF SUMMARY OF THIS INVENTION

In an embodiment, a circuit includes: a first TSCP (tri-state charge pump) configured to receive a first phase and a third phase of a six-phase signal and output a first current to a first output node; a second TSCP configured to receive a second phase and a fourth phase of the six-phase signal and output a second current to a second output node; a third TSCP configured to receive a third phase and a fifth phase of the six-phase signal and output a third current to the first output node; a fourth TSCP configured to receive a fourth phase and a sixth phase of the six-phase signal and output a fourth current to the second output node; a fifth TSCP configured to receive the fifth phase and the first phase of the six-phase signal and output a fifth current to the first output node; a sixth TSCP configured to receive the sixth phase and the second phase of the six-phase signal and output a sixth current to the second output node; and a load placed across the first output node and the second output node.

In an embodiment, a method includes the following steps: receiving a six-phase signal comprising a first phase, a second phase, a third phase, a fourth phase, a fifth phase, and a sixth phase; using a first TSCP (tri-state charge pump) to output a first current to a first output node in accordance with the first phase and the third phase of the six-phase signal; using a second TSCP to output a second current to a second output node in accordance with the second phase and the fourth phase of the six-phase signal; using a third TSCP to output a third current to the first output node in accordance with the third phase and the fifth phase of the six-phase signal; using a fourth TSCP to output a fourth current to the second output node in accordance with the fourth phase and the sixth phase of the six-phase signal; using a fifth TSCP to output a fifth current to the first output node in accordance with the fifth phase and the first phase of the six-phase signal; using a sixth TSCP to output a sixth current to the second output node in accordance with the sixth phase and the second phase of the six-phase signal; inserting a load across the first output node and the second output node; and tapping a two-phase output from the first output node and the second output node.

DETAILED DESCRIPTION OF THIS INVENTION

The present invention relates to frequency tripler. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "circuit node," "power node," "ground node," "inverter," "voltage," "current," "current source," "CMOS (complementary metal oxide semiconductor)," "PMOS (P-channel metal oxide semiconductor) transistor," "NMOS (N-channel metal oxide semiconductor) transistor," "inverter," "capacitor," "inductor," "phase," "signal," "frequency," "period," "node," and "load." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

Throughout this disclosure, "$V_{DD}$" denotes a power supply node.

A logical signal is a signal of two possible states: a first logical state (or a "high" state), and a second logical state (or a "low" state). When a logical signal is said to be high (low), it means it is in the "high" ("low") state, and it occurs the logical signal is above (below) a trip point.

Figure 1:
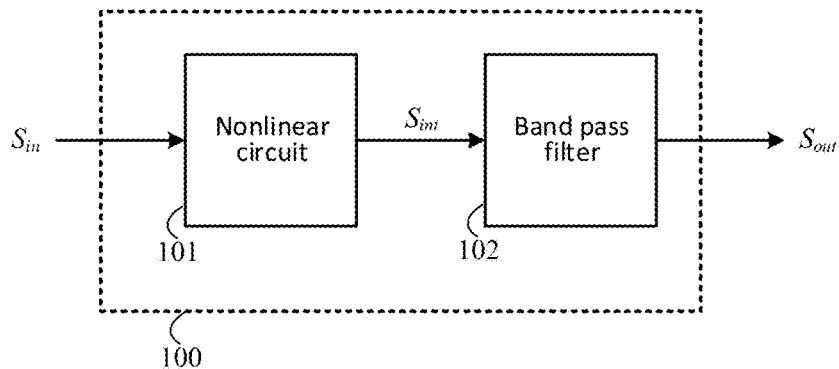
FIG. 1 shows a functional block diagram of prior art frequency tripler.
Figure 2A:
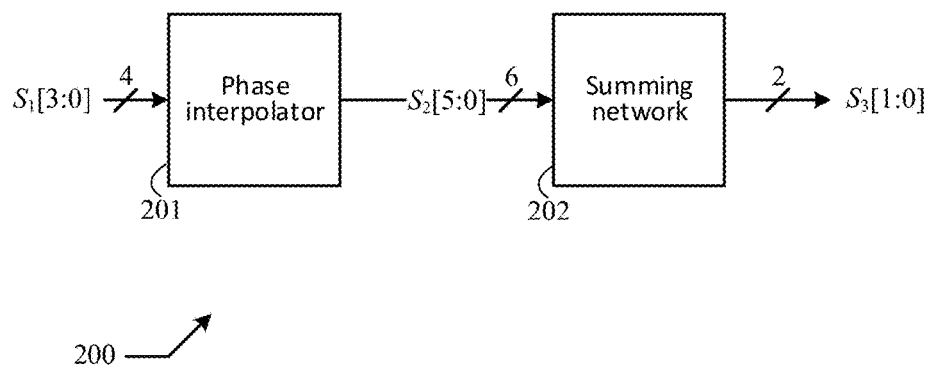
FIG. 2A shows a functional block diagram of a frequency tripler disclosed in the co-pending application.
Figure 2B:
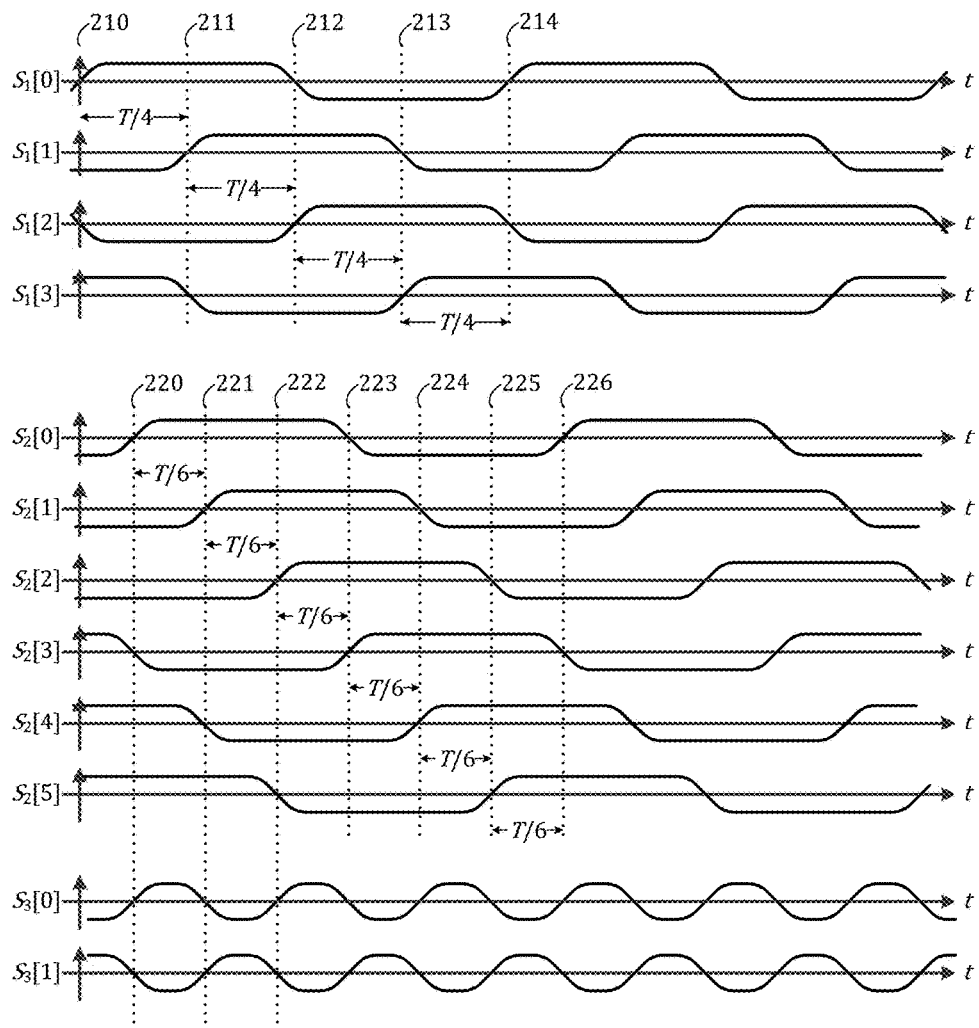
FIG. 2B shows an exemplary timing diagram of the frequency tripler of FIG. 2A.

In a co-pending application of title "Apparatus and method for frequency tripling," (U.S. application Ser. No. 15/859,827) the contents of which are incorporated herein by reference, a frequency tripler is disclosed. As depicted in FIG. 2A, the frequency tripler 200 disclosed therein includes a phase interpolator 201 configured to receive a four-phase signal $S_1[3:0]$ and output a six-phase signal $S_2[5:0]$, and a summing network 202 configured to receive the six-phase signal $S_2[5:0]$ and output a two-phase signal $S_3[1:0]$. An exemplary timing diagram is shown in FIG. 2B.

As described in co-pending application Ser. No. 15/859,827, frequency tripler 200 includes: a phase interpolator 201 configured to receive a four-phase signal $S_1[3:0]$ and output a six-phase signal $S_2[5:0]$, and a summing network 202 configured to receive the six-phase signal $S_2[5:0]$ and output a two-phase signal $S_3[1:0]$. An illustrative timing diagram of $S_1[3:0]$, $S_2[5:0]$, and $S_3[1:0]$ are depicted in FIG. 2B. As shown, $S_1[0]$, $S_1[1]$, $S_1[2]$, $S_1[3]$, $S_2[0]$, $S_2[1]$, $S_2[2]$, $S_2[3]$, $S_2[4]$, and $S_2[5]$ are all periodic with a period T and evenly separated in time. For each signal in FIG. 2B, the horizontal axis is a time variable denoted by "t," and the vertical axis is a voltage of the signal. $S_1[0]$ ($S_1[1]$, $S_1[2]$, $S_1[3]$) is said to be a first (second, third, fourth) phase of the four-phase signal $S_1[3:0]$, and has a rising edge at time instant 210 (211, 212, 213). Time instant 211 (212, 213, 214) trails time instant 210 (211, 212, 213) by T/4. Moreover, $S_2[0]$ ($S_2[1]$, $S_2[2]$, $S_2[3]$, $S_2[4]$, $S_2[5]$) is said to be a first (second, third, fourth, fifth, sixth) phase of the six-phase signal $S_2[5:0]$, and has a rising edge at time instant 220 (221, 222, 223, 224, 225). Time instant 221 (222, 223, 224, 225, 226) trails time instant 220 (221, 222, 223, 224, 225) by T/8. Here, $S_2[0]$ (which is the first phase of $S_2[5:0]$) trails $S_1[0]$ (which is the first phase of $S_1[3:0]$) in timing by approximately T/8. Furthermore, $S_3[0]$, and $S_3[1]$ are both periodic with a period T/3 and evenly separated in time. $S_3[0]$ ($S_3[1]$) is said to be a first (second) phase of the output signal $S_3[1:0]$, and has a rising edge at timing instant 220 (221). Time instant 221 (222) trails time instant 220 (323) by T/6, which is one half of the period of the output signal $S_3[1:0]$.

Mathematically, $S_1[3:0]$ can be approximated by the following equation:

$$S_1[i] = V_1^{(1)}\sin\left(\frac{2\pi t}{T} - \frac{i\pi}{2}\right) + V_1^{(3)}\sin\left(\frac{6\pi t}{T} - \frac{3i\pi}{2}\right) + V_{M1}, \quad (1)$$

for $i = 1, 2, 3$.

Here, $V_1^{(1)}$ and $V_1^{(3)}$ are amplitudes of the fundamental component and the third harmonic component of $S_1[3:0]$, respectively, and $V_{M1}$ is a first constant. Based on equation (1), $S_1[0]$, $S_1[1]$, $S_1[2]$, and $S_1[3]$ can be said to be representative of a 0-degree, 90-degree, 180-degree, and 270-degree phase, respectively, as far as the fundamental component is concerned. Although $S_1[3:0]$ also contain additional harmonic components, only the fundamental component and the third harmonic component are considered here since they are the top two components among all. $S_2[5:0]$ can be approximated by the following equation:

$$S_2[i] = V_2^{(1)}\sin\left(\frac{2\pi t}{T} - \frac{i\pi}{3} - \frac{\pi}{4}\right) + V_2^{(3)}\sin\left(\frac{6\pi t}{T} - i\pi - \frac{3\pi}{4}\right) + V_{M2}, \quad (2)$$

for $i = 0, 1, 2, 3, 4, 5$.

Here, $V_2^{(1)}$ and $V_2^{(3)}$ are amplitudes of the fundamental component and the third harmonic component of $S_2[5:0]$, respectively, and $V_{M2}$ is a second constant. Based on equation (2), $S_2[0]$, $S_2[1]$, $S_2[2]$, $S_2[3]$, $S_2[4]$, and $S_2[5]$ can be said to be of a 45-degree, 105-degree, 165-degree, 225-degree, 285-degree, and 345-degree phase, respectively, as far as the fundamental component is concerned.

Although the frequency tripler 200 is an improvement over prior art frequency tripler 100, further improvement, if possible, is desired.

Figure 3:
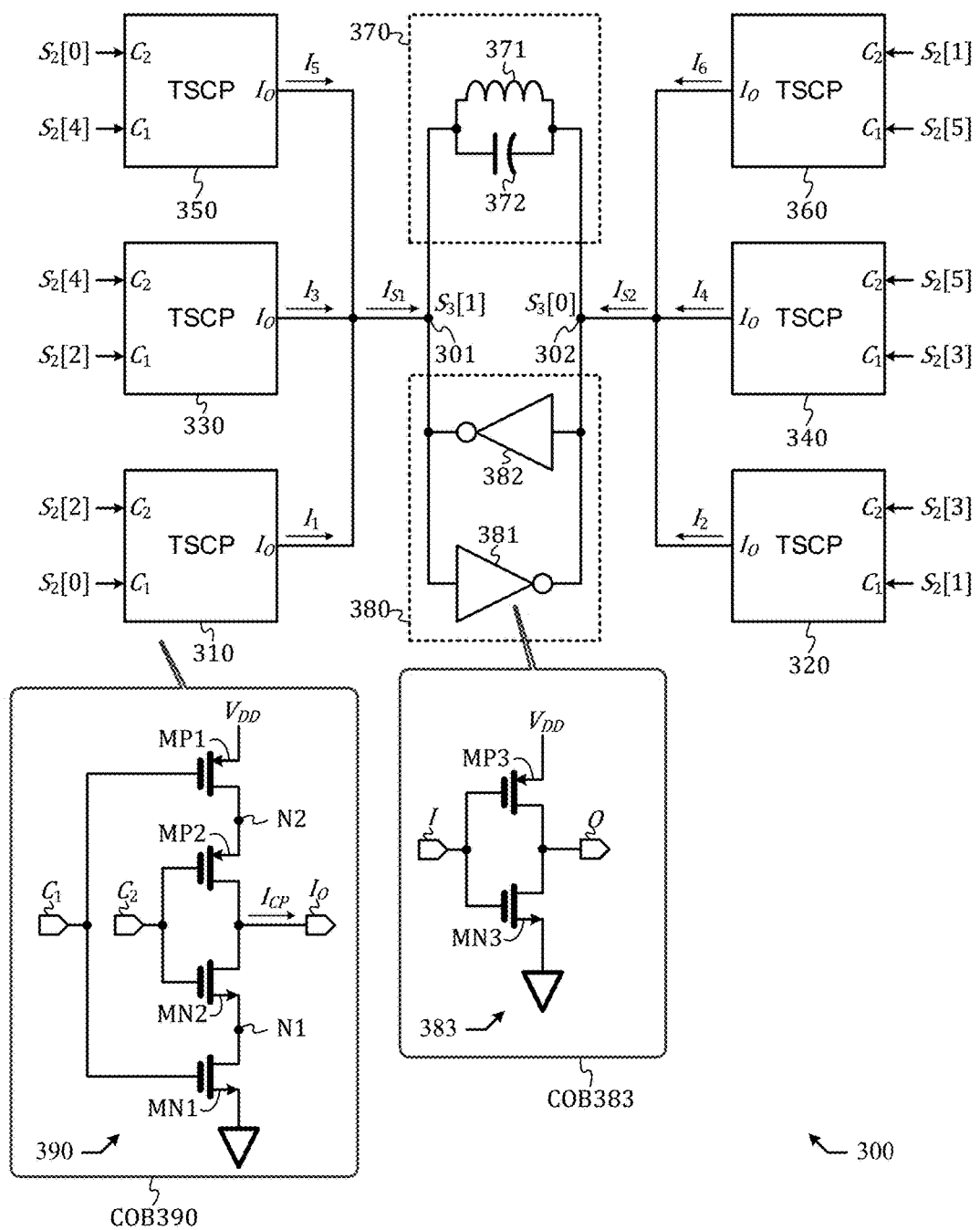
FIG. 3 shows a schematic diagram of a pulse combiner in accordance with an embodiment of the present invention.

This present disclosure improves the performance of the frequency tripler 200 of FIG. 2A by replacing the summing network 202 with a pulse combiner. A schematic diagram of a pulse combiner 300 in accordance with an embodiment of the present invention is shown in FIG. 3. Pulse combiner 300 replaces the summing network 220 and is configured to receive the six-phase signal $S_2[5:0]$ and to output the two-phase signal $S_3[1:0]$. The six-phase signal six-phase signal $S_2[5:0]$ is a periodic logical signal of period T. Pulse combiner 300 comprises a first TSCP (tri-state charge pump) 310, a second TSCP 320, a third TSCP 330, a fourth TSCP 340, a fifth TSCP 350, and a sixth TSCP 360, and a load 370. In a further embodiment, pulse combiner 300 further includes a cross-coupling inverter pair 380 comprising a first inverter 381 and a second inverter 382. The six TSCPs 310, 320, 330, 340, 350, 360 are embodied by TSCP 390 shown inside callout box COB390. Inverters 381 and 382 are embodied by instantiating an inverter 383 shown inside callout box COB383. TSCP 390 has a first control pin "$C_1$," a second control pin "$C_2$," and an output pin "$I_O$." TSCP 310 (320, 330, 340, 350, 360) receives $S_2[0]$ ($S_2[1]$, $S_2[2]$, $S_2[3]$, $S_2[4]$, $S_2[5]$) and $S_2[2]$ ($S_2[3]$, $S_2[4]$, $S_2[5]$, $S_2[0]$, $S_2[1]$) via its "$C_1$" pin and "$C_2$" pin, respectively, and outputs a first (second, third, fourth, fifth, sixth) current $I_1$ ($I_2$, $I_3$, $I_4$, $I_5$, $I_6$) via its "$I_O$" pin. Currents $I_1$, $I_3$, and $I_5$ are summed into a first output current $I_{S1}$ directed to a first output node 301, resulting in $S_3[1]$, while currents $I_2$, $I_4$, and $I_6$ are summed into a second output current $I_{S2}$ directed to a second output node 302, resulting in $S_3[0]$.

By way of example but not limitation, load 370 comprises a parallel connection of an inductor 371 and a capacitor 372 placed across the first output node 301 and the second output node 302, embodying a resonant tank configured to provide a high impedance at the third harmonic frequency of $S_3[5:0]$, thus enabling large current-to-voltage conversion gain for the two output currents $I_{S1}$ and $I_{S2}$. Cross-coupling inverter pair 380 provides a regenerative load (across the first output node 301 and the second output node 302), thus further enlarging the current-to-voltage conversion gain.

TSCP 390 comprises two NMOS transistors MN1 and MN2, and two PMOS transistors MP1 and MP2. The source, the gate, and the drain of NMOS transistor MN1 connect to ground, the "$C_1$" pin, and a first internal node N1, respectively. The source, the gate, and the drain of PMOS transistor MP1 connect to "$V_{DD}$," the "$C_1$" pin, and a second internal node N2, respectively. The source, the gate, and the drain of NMOS transistor MN2 connect to the first internal node N1, the "$C_2$" pin, and the "$I_O$" pin, respectively. The source, the gate, and the drain of PMOS transistor MP2 connect to the second internal node N2, the "$C_2$" pin, and the "$I_O$" pin, respectively. TSCP 390 has three states: "negative," "positive," and "zero." When the two control signals at the two control pins "$C_1$" and "$C_2$" are both high, TSCP 390 is in the "negative" state, wherein the two PMOS transistors MP1 and MP2 are turned off while the two NMOS transistors MN1 and MN2 are turned on, resulting in a current sinking from the "$I_O$" pin to ground and thus a negative value of a charge pump output current $I_{CP}$; otherwise, when the two control signals at the two control pins "$C_1$" and "$C_2$" are both low, TSCP 390 is in the "positive" state, wherein the two NMOS transistors MN1 and MN2 are turned off while the two PMOS transistors MP1 and MP2 are turned on, resulting in a current sourcing from "$V_{DD}$" to the "$I_O$" pin and thus a positive value of the charge pump output current $I_{CP}$; otherwise, TSCP 390 is in the "zero" state, wherein there is no conduction path between the "$I_O$" pin and either "$V_{DD}$" or ground and thus the charge pump output current $I_{CP}$ is zero. Note that the charge pump output current $I_{CP}$ embodies $I_1$ ($I_2$, $I_3$, $I_4$, $I_5$, $I_6$) when the TSCP 390 is instantiated to embody TSCP 310 (320, 330, 340, 350, 360).

Reference is now made to both FIG. 2B and FIG. 3. When $S_2[0]$ and $S_2[2]$ are both high (low), while at the same time $S_2[3]$ and $S_2[5]$ are both low (high), for instance during the interval between timing instants 222 (225) and 223 (226), $I_1$ is negative (positive) and $I_4$ is positive (negative), while $I_2$, $I_3$, $I_5$, and $I_6$ are all zero; in this case, $I_{S1}$ is negative (positive) and $I_{S2}$ is positive (negative), resulting in a negative (positive) pulse of $S_3[1]$ and at the same time a positive (negative) pulse of $S_3[0]$. When $S_2[2]$ and $S_2[4]$ are both high (low), while at the same time $S_2[5]$ and $S_2[1]$ are both low (high), for instance during the interval between timing instants 224 (221) and 225 (222), $I_3$ is negative (positive) and $I_6$ is positive (negative), while $I_1$, $I_2$, $I_4$, and $I_5$ are all zero; in this case, $I_{S1}$ is negative (positive) and $I_{S2}$ is positive (negative), resulting in a negative (positive) pulse of $S_3[1]$ and at the same time a positive (negative) pulse of $S_3[0]$. When $S_2[4]$ and $S_2[0]$ are both high (low), while at the same time $S_2[1]$ and $S_2[3]$ are both low (high), for instance during the interval between timing instants 220 (223) and 221 (224), $I_5$ is negative (positive) and $I_2$ is positive (negative), while $I_1$, $I_3$, $I_4$, and $I_6$ are all zero; in this case, $I_{S1}$ is negative (positive) and $I_{S2}$ is positive (negative), resulting in a negative (positive) pulse of $S_3[1]$ and at the same time a positive (negative) pulse of $S_3[0]$. TSCP 310, 330, and 350 form a first set, while TSCP 320, 340, and 360 form a second set. Due to six-phase nature of $S_2[5:0]$, in any moment there is one and only one TSCP in the first set that is in a non-zero state (either "negative" or "positive"), and there is one and only one TSCP in the second set that is in a complementary non-zero state (either "positive" or "negative"). The first set and the second set work complementarily in a ping-pong manner and alternate between "positive" and "negative" states, thus alternately generating complementary pulses for $S_3[1]$ and $S_3[0]$ of width T/6. As a result, $S_3[1:0]$ is a two-phase signal of period T/3. A frequency tripling function is thus fulfilled.

Inverter 383 comprises a NMOS transistor MN3 and a PMOS transistor MP3 configured to receive an input from an input pin "I" and output an output to an output pin "O." When instantiating inverter 383 to embody inverter 381 (382), the input pin "I" connects to the first (second) output node 301 (302) and the output pin "O" connects to the second (first) output node 302 (301).

Pulse combiner 300 of FIG. 3 has a better efficiency than summing network 202 of FIG. 2A. As explained, summing network 202 performs a summing of $S_3[5:0]$ such that the fundamental frequency component is cancelled while the third harmonic component is preserved, wherein some energy is spent on performing the cancellation of the fundamental frequency component. In contrast, pulse combiner 300 directly generates pulses of the third harmonic component, and no energy is wasted in performing the cancellation of the fundamental frequency component.

Figure 4:
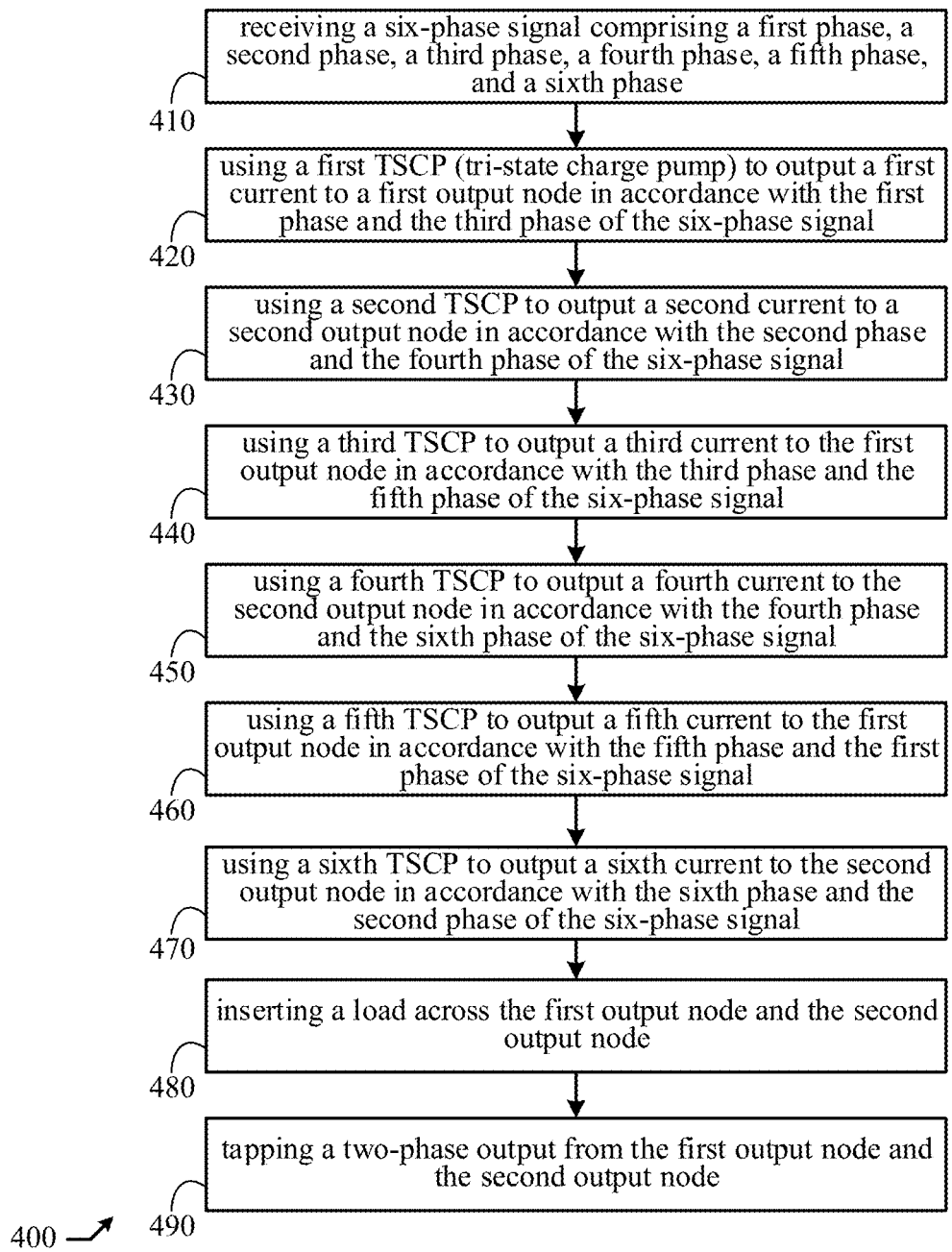
FIG. 4 shows a flow diagram of a method in accordance with the present invention.

In an embodiment illustrated by a flow diagram 400 shown in FIG. 4, a method comprises the following steps: (step 410) receiving a six-phase signal comprising a first phase, a second phase, a third phase, a fourth phase, a fifth phase, and a sixth phase; (step 420) using a first TSCP (tri-state charge pump) to output a first current to a first output node in accordance with the first phase and the third phase of the six-phase signal; (step 430) using a second TSCP to output a second current to a second output node in accordance with the second phase and the fourth phase of the six-phase signal; (step 440) using a third TSCP to output a third current to the first output node in accordance with the third phase and the fifth phase of the six-phase signal; (step 450) using a fourth TSCP to output a fourth current to the second output node in accordance with the fourth phase and the sixth phase of the six-phase signal; (step 460) using a fifth TSCP to output a fifth current to the first output node in accordance with the fifth phase and the first phase of the six-phase signal; (step 470) using a sixth TSCP to output a sixth current to the second output node in accordance with the sixth phase and the second phase of the six-phase signal; (step 480) inserting a load across the first output node and the second output node; and (step 490) tapping a two-phase output from the first output node and the second output node.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A circuit comprising:
   a first TSCP (tri-state charge pump) configured to receive a first phase and a third phase of a six-phase signal and output a first current to a first output node;
   a second TSCP configured to receive a second phase and a fourth phase of the six-phase signal and output a second current to a second output node;
   a third TSCP configured to receive a third phase and a fifth phase of the six-phase signal and output a third current to the first output node;
   a fourth TSCP configured to receive a fourth phase and a sixth phase of the six-phase signal and output a fourth current to the second output node;
   a fifth TSCP configured to receive the fifth phase and the first phase of the six-phase signal and output a fifth current to the first output node;
   a sixth TSCP configured to receive the sixth phase and the second phase of the six-phase signal and output a sixth current to the second output node; and
   a load placed across the first output node and the second output node.

2. The circuit of claim 1, wherein the first TSCP, the second TSCP, the third TSCP, the fourth TSCP, the fifth TSCP, and the sixth TSCP are all embodied by instantiating a charge pump circuit that has three states including a negative output current state, a positive output current state, and a zero output current state in accordance with two control signals, each of which is a logical signal that is either in a first logical state or in a second logical state.

3. The circuit of claim 2, the charge pump circuit is in the negative output current state when the two control signals are both in a first logical state, in the positive output current state when the two control signals are both in a second logical state, and otherwise in the zero output current state.

4. The circuit of claim 3, wherein the first phase and the third phase of the six-phase signal are the two control signals for the first TSCP, the second phase and the fourth phase of the six-phase signal are the two control signals for the second TSCP, the third phase and the fifth phase of the six-phase signal are the two control signals for the third TSCP, the fourth phase and the sixth phase of the six-phase signal are the two control signals for the fourth TSCP, the fifth phase and the first phase of the six-phase signal are the two control signals for the fifth TSCP, and the sixth phase and the second phase of the six-phase signal are the two control signals for the sixth TSCP.

5. The circuit of claim 1, wherein the load comprises a parallel connection of an inductor and a capacitor placed across the first output node and the second output node.

6. The circuit of claim 5, wherein in the load is configured to have a resonant frequency approximately equal to a third harmonic of the six-phase signal.

7. The circuit of claim 1 further comprises a cross-coupling inverter pair configured to provide a regenerative load across the first output node and the second output node.

8. A method comprising:
receiving a six-phase signal comprising a first phase, a second phase, a third phase, a fourth phase, a fifth phase, and a sixth phase;
using a first TSCP (tri-state charge pump) to output a first current to a first output node in accordance with the first phase and the third phase of the six-phase signal;
using a second TSCP to output a second current to a second output node in accordance with the second phase and the fourth phase of the six-phase signal;
using a third TSCP to output a third current to the first output node in accordance with the third phase and the fifth phase of the six-phase signal;
using a fourth TSCP to output a fourth current to the second output node in accordance with the fourth phase and the sixth phase of the six-phase signal;
using a fifth TSCP to output a fifth current to the first output node in accordance with the fifth phase and the first phase of the six-phase signal;
using a sixth TSCP to output a sixth current to the second output node in accordance with the sixth phase and the second phase of the six-phase signal;
inserting a load across the first output node and the second output node; and
tapping a two-phase output from the first output node and the second output node.

9. The method of claim 8, wherein the first TSCP, the second TSCP, the third TSCP, the fourth TSCP, the fifth TSCP, and the sixth TSCP are all embodied by instantiating a charge pump circuit that has three states including a negative output current state, a positive output current state, and a zero output current state in accordance with two control signals, each of which is a logical signal that is either in a first logical state or in a second logical state.

10. The method of claim 9, the charge pump circuit is in the negative output current state when the two control signals are both in a first logical state, in the positive output current state when the two control signals are both in a second logical state, and otherwise in the zero output current state.

11. The method of claim 10, wherein the first phase and the third phase of the six-phase signal are the two control signals for the first TSCP, the second phase and the fourth phase of the six-phase signal are the two control signals for the second TSCP, the third phase and the fifth phase of the six-phase signal are the two control signals for the third TSCP, the fourth phase and the sixth phase of the six-phase signal are the two control signals for the fourth TSCP, the fifth phase and the first phase of the six-phase signal are the two control signals for the fifth TSCP, and the sixth phase and the second phase of the six-phase signal are the two control signals for the sixth TSCP.

12. The method of claim 8, wherein the load comprises a parallel connection of an inductor and a capacitor placed across the first output node and the second output node.

13. The method of claim 12, wherein in the load is configured to have a resonant frequency approximately equal to a third harmonic of the six-phase signal.

14. The method of claim 8 further comprises a cross-coupling inverter pair configured to provide a regenerative load across the first output node and the second output node.

* * * * *